April 3, 1951 R. R. CHAPMAN 2,547,621
ELECTRONIC AMPLIFIER FOR MOTOR CONTROLS
Filed May 9, 1946
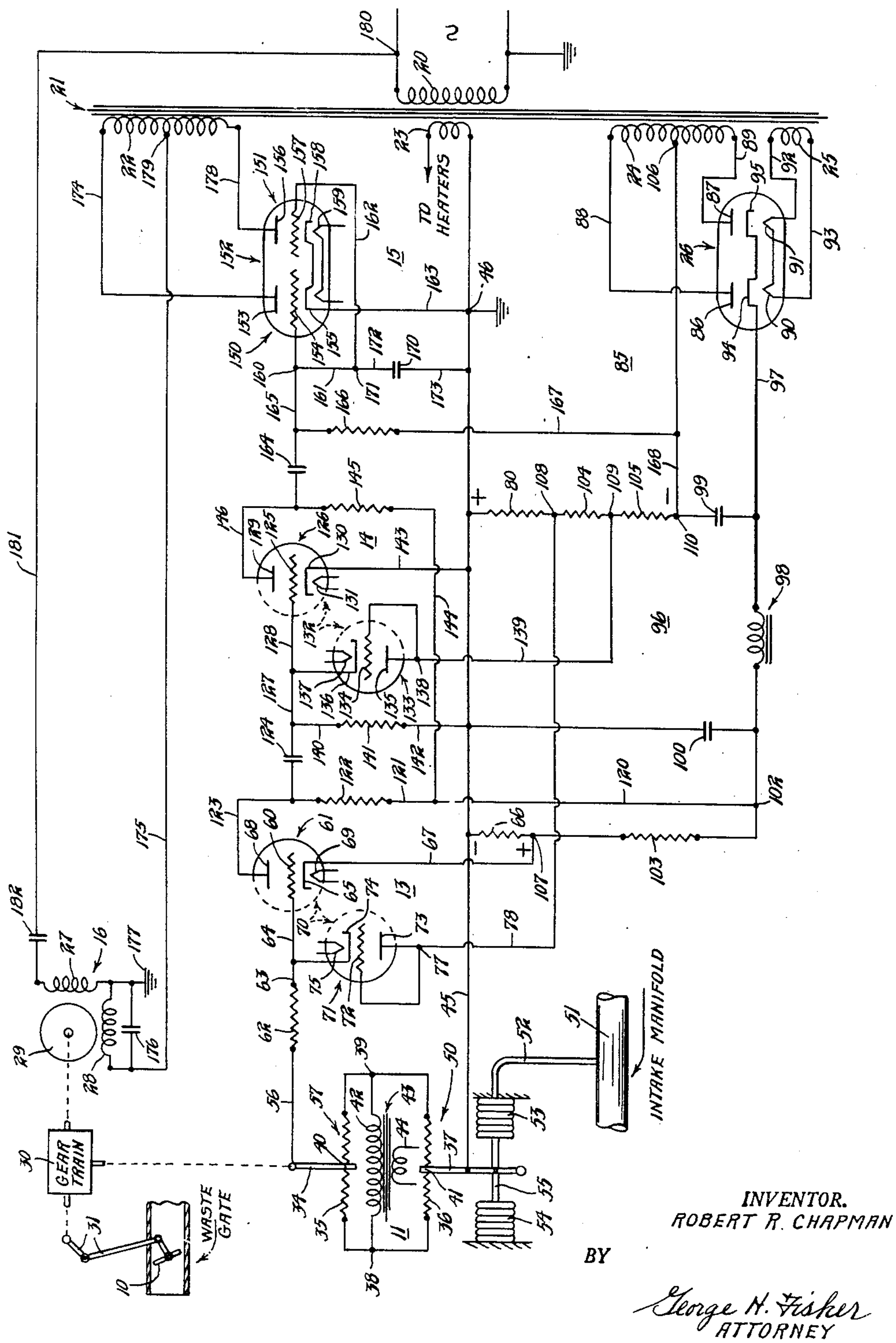
INVENTOR.
ROBERT R. CHAPMAN
BY George H. Fisher
ATTORNEY Patented Apr. 3, 1951 2,547,621

UNITED STATES PATENT OFFICE 2,547,621

ELECTRONIC AMPLIFIER FOR MOTOR CONTROLS

Robert R. Chapman, Minneapolis, Minn., assignor to Minneapolis-Honeywell Regulator Company, Minneapolis, Minn., a corporation of Delaware Application May 9, 1946, Serial No. 668,362

2 Claims. (Cl. 250—27)

The present invention is concerned with an improved amplifier of the type incorporating a phase discriminator stage.

It is often desirable in connection with condition control systems to provide an amplifier which is capable of amplifying a signal voltage which varies in magnitude and phase with a given condition, the amplifier being effective to supply to a motor or other electrical device operating a condition changing means, a voltage which is reversible in phase in accordance with the signal voltage. Since the electrically operated device often operates in a manner dependent upon the phase relationship between the voltage supplied to it by the amplifier and the standard voltage, it is imperative that the phase relationship between the voltage supplied to the device by the amplifier under a given set of conditions and that of the standard voltage does not change. Consequently, it has been proposed to employ a discriminator stage within the amplifier which discriminator stage is energized from a current source related to the standard source of voltage. Whenever the input voltage to this discriminator stage, as amplified by the earlier stages of the amplifier, has a predetermined relationship with respect to the voltage applied to the discriminator stage, current is supplied to the electrical device. A typical arrangement of this type is that shown in the co-pending application of Albert P. Upton, Serial No. 437,561, filed April 3, 1942, now U. S. Patent No. 2,423,534. In such an arrangement, it is highly desirable that the signal voltage be amplified in the earlier stages of the amplifier without any great distortion. Otherwise, the discriminator stage may operate erratically. In many condition responsive systems, however, there is a very great variation in the amplitude of the signal voltage and if the system is designed to be sensitive with very small signal voltages, such as is necessary if accurate control of the condition is maintained, it is very difficult to provide for the amplification of large signal voltages without excessive distortion.

An object of the present invention is to provide an arrangement in which the voltage supplied to the input of the discriminator stage is maintained relatively constant despite very large variations in the input voltage.

A further object of the present invention is to provide such an arrangement in which limiter tubes are provided for limiting the maximum amplitude of the voltage which can be supplied to the input circuit of any one stage.

A still further object of the present invention is to provide a multi-stage amplifier having a power stage supplied with an alternating source of power and at least one voltage amplification stage in which limiting means is provided for causing the voltage amplification stage to supply a flat top input voltage to the input circuit of the power stage.

A still further object of the present invention is to provide a multi-stage amplifier having novel means for "clipping" a voltage amplified by the amplifier.

Other objects of the invention will be apparent from a consideration of the accompanying specification, claims, and drawings, of which The single figure shows schematically my improved amplifier employed in connection with a system for controlling the pressure within the intake manifold of an internal combustion engine.

Referring to the figure, my invention is shown therein, by way of example, as applied to a control system wherein the position of a valve, such as a waste gate 10 of a turbo supercharger (not shown) is modulated in accordance with the balance or unbalance of a bridge circuit 11. In the system, the unbalance potential of the bridge circuit 11 is applied to the input of an amplifier having two preliminary voltage amplification stages 13 and 14, and an output discriminator stage 15. A motor 16 of the split phase type has one phase supplied directly from a source of power, and the other phase supplied from the output circuit of the amplifier stage 15. Power is supplied to the system from any suitable source of alternating current, to which is connected primary winding 20 of a transformer 21. Transformer 21 has a plurality of secondary windings 22, 23, 24, and 25. Winding 22 supplies plate voltage to the output stage 15. Winding 23 supplies heater voltage for the tubes in the amplifier. Windings 24 and 25 are connected to rectifier tube 26 of a conventional full wave rectifier circuit.

Motor 16 is provided with a pair of field windings 27 and 28 and a rotor 29. As stated above, the motor is of the split phase type wherein, as is well known in the art, field windings 27 and 28 are displaced in space phase, and wherein the displacement in time phase of the current flowing through the windings determines the direction of rotation of the rotor 29. Rotor 29 drives a gear train generally indicated at 30. The output shaft of the gear train 30 is connected to position the waste gate 10 through a mechanical linkage 31. The output shaft of gear train 30 also drives a sliding contact 34 across a slidewire resistor 35.

The bridge circuit 11 includes a pair of slidewire resistors 35 and 36, having a pair of slider arms 34 and 37. The bridge circuit 11 has a pair of input terminals 38 and 39 and a pair of output terminals 40 and 41. Output terminal 40 is the point of engagement of slider 34 and slidewire resistor 35. Output terminal 41 is the point of engagement of slider 37 on slidewire resistor 36. Input terminals 38 and 39 are connected to the terminals of transformer secondary winding 42 of a transformer 43. Primary winding 44 of transformer 43 is connected to the same alternating current source as primary winding 20 of transformer 21.

The bridge circuit 11 includes the secondary winding 42, across whose terminals slidewire resistor 36 is connected. A slider 37 cooperates with resistor 36 and is connected to conductor 45, which is grounded at junction point 46. Slider 37 and resistor 36 form a main controller 50. The main controller 50 is operated in accordance with the absolute pressure existing within a conduit 51 which, for example, may be the intake manifold of an internal combustion engine. A pressure take-off duct 52 connects the intake manifold with the interior of a bellows 53. A second bellows 54 is evacuated, so that its expansion and contraction depend only upon atmospheric pressure. The two bellows 53 and 54 are mounted with their free ends extending toward each other, so that the system is independent of atmospheric pressure. The center point on a link 55 between the free ends is connected, as by a pin and slot connection, with the slider 37.

The second slidewire resistor 35 is also connected across the terminals of secondary winding 42. Slider 34 cooperates with the resistor 35 and is connected to a conductor 56. Slider 34 with resistor 35 forms a follow-up potentiometer 57. Slider 34 is moved along the resistor 35 by the motor 16, acting through the gear train 30, and concurrently with the movement of the waste gate 10.

Output terminal 40 of bridge circuit 11 is connected to a control grid 60 of a triode 61 through the slider 34, conductor 56, resistor 62, and conductors 63 and 64. Output terminal 41 is connected to a cathode 65 of the triode 61 through a slider 37, conductor 45, resistor 66, and conductor 67. The triode 61 in the first preliminary stage 13 also includes an anode 68 and heater 69.

Triode 61 forms one-half of a twin triode 70, which may be of the type commercially known as type 12SL7. The twin triode 70 has, in addition to triode 61, a triode 71 including a control grid 72, anode 73, cathode 74, and heater 75. The control grid 72 of triode 71 is externally connected to the anode 73 at junction point 77 so that the triode functions as a diode. The cathode 74 of triode 71 is connected to the control grid 60 of triode 61 by conductor 64. Anode 73 of triode 71 is connected to the cathode 65 of triode 61 by conductor 78, resistor 80, conductor 45, resistor 66, and conductor 67. This effectively connects the triode 71 in parallel with the input signal to the first preliminary stage 13.

The rectifier circuit 85, which is of the conventional full wave type, furnishes plate voltage to the two preliminary stages 13 and 14, and bias voltages to all three stages of the amplifier. The rectifier tube 26 has a pair of anodes 86 and 87 which are connected to secondary winding 24 by conductors 88 and 89. The heater elements 90 and 91 are connected to secondary winding 25 by conductors 92 and 93. The rectifier tube 26, which may be of the type commercially known as type 6X5, also includes cathodes 94 and 95. The input of a filter network 96 is connected to the cathodes 94 and 95 of the rectifier tube 26 by means of a conductor 97. The filter network 96 includes a choke coil 98 and a pair of condensers 99 and 100. The positive output terminal 102 of the filter network 96 is connected to the grounded conductor 45 through bleeder resistors 103 and 66. Resistors 80, 104, and 105 are connected between the grounded conductor 45 and the center tap 106 of the high voltage secondary winding 24. A positive unidirectional potential, with respect to the grounded conductor 45, is available at junction points 102 and 107. A negative unidirectional potential, with respect to the grounded conductor 45, is available at junction points 108, 109, and 110.

The input circuit of the first preliminary stage 13 may be traced from the control grid 60 through conductors 64 and 63, resistor 62, conductor 56, slider 34, bridge circuit output terminal 40, bridge circuit 11, bridge circuit output terminal 41, slider 37, grounded conductor 45, resistor 66, conductor 67, to the cathode 65 of triode 61.

The output circuit of the first preliminary stage 13 may be traced from the positive output terminal 102 of the power supply through conductors 120 and 121, load resistor 122, conductor 123, anode 68, cathode 65, conductor 67, and resistor 66 to the grounded conductor 45.

The output circuit of preliminary stage 13 is coupled to the input circuit of the second preliminary stage 14 by a condenser 124, one terminal of which is connected through conductor 123 to anode 68 of triode 61, and the other terminal of which is connected to a control grid 125 of a triode 126 by conductors 127 and 128. The condenser 124 serves to transmit any alternating signal appearing in the output circuit of stage 13 to the input circuit of stage 14, while blocking the plate voltage of stage 13 from the input circuit of stage 14.

The triode 126 of the second preliminary stage 14 also includes an anode 129, a cathode 130, and a heater 131. Triode 126 forms one-half of the twin triode 132, which may be of the type commercially known as type 12SL7. The twin triode 132 also includes a triode 133 including a control grid 134, anode 135, cathode 136, and heater 137. The control grid 134 of triode 133 is externally connected to the anode 135 at junction point 138 so as to cause triode 133 to function as a diode. The cathode 136 of triode 133 is connected to the control grid 125 of triode 126 by a conductor 128. The anode 135 of triode 133 is connected to the cathode 130 of triode 126 by conductor 139, resistor 104, resistor 80, and conductors 45 and 143. This effectively connects the triode 133 in parallel with the input signal to the second preliminary stage 14.

The input circuit of the second preliminary stage 14 may be traced from the control grid 125 through conductors 128, 127, and 140, resistor 141, conductors 142, 45, and 143, to the cathode 130 of triode 126. The output circuit of the second preliminary stage 14 may be traced from the positive output terminal 102 of the power supply through conductors 120 and 144, load resistor 145, conductor 146, anode 129, cathode 130, and conductor 143 to the grounded conductor 45.

The output stage 15 includes a pair of triodes 150 and 151 in a twin triode 152. Triode 150 includes an anode 153, a control grid 154, and a cathode 155. Triode 151 includes an anode 156, a control grid 157, and a cathode 158. Twin triode 152 also includes a suitable heater element 159 for heating both of the cathodes 155 and 158.

The control electrodes 154 and 157 are connected to a common junction 160 by means of conductors 161 and 162. The cathodes 155 and 158 are internally connected in twin triode 152, which may be of the type commercially known as type 3C33. The cathodes 155 and 158 are connected to the grounded junction point 46 on conductor 45 by means of conductor 163.

The output circuit of the second preliminary stage 14 is coupled to the input circuit of the final stage 15 by means of a coupling condenser 164. One terminal of the condenser 164 is connected by conductor 146 to anode 129 of triode 126, the other terminal being connected to the junction point 160 of the control grids 154 and 157 by conductor 165.

The input circuit of the final output stage may be traced from the junction point 160 of the control grids 154 and 157 through conductor 165, resistor 166, conductors 167 and 168, resistors 105, 104, and 80, to the grounded conductor 45.

A filter condenser 170 is connected between junction point 171 of conductors 161 and 162 and the grounded conductor 45 by means of conductors 172 and 173. The condenser 170 bypasses high frequency components appearing in the output of stage 14 and passing through the coupling condenser 164, thereby substantially preventing such components from affecting the control grids 154 and 157.

The output circuit of triode 150 may be traced from the upper terminal of secondary 22 through conductor 174, anode 153, cathode 155, conductor 163, grounded junction points 46 and 177, motor winding 28 and conductor 175 back to the center tap 179 of secondary 22.

The output circuit of triode 151 may be traced from the lower terminal of secondary 22 through conductor 178, anode 156, cathode 158, conductor 163, grounded junction points 46 and 177, winding 28 and conductor 175 back to the center tap 179 of secondary 22.

Motor winding 27 may be supplied with energy from a suitable alternating current source such as junction point 180, through conductor 181 and condenser 182.

Condenser 182 is chosen so as to form with winding 27 a series resonant circuit. Since this circuit is resonant, the current flowing in it, and hence the current in motor winding 27, is in time phase with the terminal potential of transformer winding 20. The terminal potential of winding 27 leads this current by an angle of approximately 90 electrical degrees, due to the inductance of the winding.

Motor winding 28 may receive electrical energy in two ways: (1) By transmission from output stage 15 through conductor 175, and (2) By induction through transformer action from motor winding 27 when the motor is running. A condenser 176 is connected across the terminals of motor winding 28. This condenser 176 is so chosen with relation to the impedance of winding 28 that the two together form a parallel circuit resonant at the supply frequency. It will be seen that condenser 176 and winding 28 form a parallel resonant circuit of high impedance with respect to external current transmitted to winding 28 through conductor 175. On the other hand, condenser 176 and winding 28 form a series resonant circuit of low impedance with respect to internal current induced in winding 28 by transformer action from winding 27.

The fluxes produced by each of the windings 27 and 28 in the motor do not link the other winding when the motor is standing still. When the motor is rotating, however, the armature reaction distorts the magnetic field in the motor so that winding 28 is linked by a portion of the flux produced by winding 27. This flux induces a current in winding 28, which is the current previously referred to as being produced by transformer action under running conditions.

The impedance of condenser 176 and winding 28 is such that maximum power is applied to the motor with minimum anode dissipation in triodes 150 and 151 for the maximum allowable anode supply voltage.

The values set forth in the following table are provided to illustrate more completely the specific amplifier circuit which has been constructed to carry out the principles of my invention. It should be understood, however, that these values are provided by way of example only, and that other values may be used without departing from the invention.

| Reference Numeral | Characteristic | Suggested Values |
|---|---|---|
| 62 | Resistance | 15,000 ohms. |
| 122, 166 | do | 470,000 ohms. |
| 141 | do | 1 megohm. |
| 145 | do | 220,000 ohms. |
| 66 | do | 100 ohms. |
| 80 | do | 150 ohms. |
| 103 | do | 25,000 ohms. |
| 104 | do | 560 ohms. |
| 105 | do | 5,000 ohms. |
| 99 | Capacitance | 0.05 microfarad. |
| 100 | do | 0.1 microfarad. |
| 124, 164 | do | 0.01 microfarad. |
| 170 | do | 0.001 microfarad. |
| 22 | Terminal Voltage | 395 volts each side of tap 179. |
| 23 | do | 12.6 volts. |
| 24 | do | 360 volts each side of tap 106. |
| 25 | do | 6.3 volts. |
| 107 | Bias Voltage | +1.1 volts. |
| 108 | do | −1.8 volts. |
| 109 | do | −9.0 volts. |
| 110 | do | −73.0 volts. |

*Operation*

When the bridge circuit 11 is balanced, the output terminals 40 and 41 are at the same potential, and hence no signal is applied to the input circuit of the amplifier. Therefore, no signal is produced in the output circuit of the second preliminary stage 14 and no signal is applied to the input circuit of the output stage 15. Triodes 150 and 151 have a negative potential applied to their control grids 154 and 157 from junction point 110 in the power supply. This negative potential is of such a magnitude as to limit the anode current of triodes 150 and 151 to a negligible value. Therefore, the waste gate 10 is maintained in the position which it has previously reached.

Let it be assumed that the pressure in the conduit 51 increases. This causes a slider arm 37 to move to the left as it appears on the drawing producing an unbalance of the bridge circuit 11 in such a direction that the potential appearing between sliders 34 and 37 is of the same phase as the potential between terminals 39 and 38, respectively. Let us arbitrarily select triode 150 in the output discriminator stage 15 as the triode section of twin triode 152 which is supplied with plate potential in time phase with the unbalance potential from bridge circuit 11 when the slider arm 37 responds to an increase in pressure in conduit 51. The signal is transmitted through the two preliminary stages and appears on the input circuit of the output stage in phase with the output voltage of the triode 150, thereby rendering triode 150 conductive. The output stage 15 then supplies to the motor winding 28 an alternating potential which is in time phase with a potential in the upper half of transformer secondary winding 22, as it appears on the drawing. The current through winding 28 lags behind this potential due to the inductance of the winding. Since motor winding 27 is continuously energized with current in phase with the supply potential, the two windings 27 and 28 are now energized with current displaced in phase, and rotation of motor 16 follows. This rotation is transmitted through gear train 30 so as to drive waste gate 10 towards open position. The gear train 30 also causes the slider 34 to move to the left along slidewire resistor 35, so as to restore the balance of the bridge circuit 11. As soon as balance is restored, the signal to the amplifier again drops to zero, thereby stopping rotation of the motor 16.

In a corresponding manner, a decrease of pressure in conduit 51 causes an unbalance of the bridge circuit 11 in such a direction that the phase of its output potential is shifted in the opposite direction. The potential applied to the input circuit of the output stage 15 is then in phase with the potential supplied to triode 151 from the lower half of transformer secondary winding 22, as it appears on the drawing. This potential causes triode 151 to conduct. The current then supplied to the motor winding 28 is opposite in phase to that supplied during the operation previously described. Motor 16 therefore rotates in the opposite direction, driving the waste gate 10 towards its closed position and moving the slider 34 to the right along slidewire resistor 35, so as to restore the balance of the bridge circuit 11.

Where the signal voltage is applied by a bridge which is unbalanced according to the value of a condition such as is shown in the present application, very large variations in signal voltage may occur. For example, if the pressure suddenly changes by a very large amount, the amplitude of the signal voltage may be many times that occurring when the pressure change is very small or slow. If the pressure change is slow, in order to maintain the pressure accurately at the desired value, it is necessary for the amplifier to be capable of operating the motor when very small signal voltages occur. Normally, the pressure changes sufficiently slowly so that upon the occurrence of a very small pressure change, the resultant movement of the waste gate tends to combat that pressure change and prevent it from ever exceeding a relatively small value. Thus, any large sudden pressure change results in a signal voltage many times that at which the amplifier first starts to cause operation of the motor. With a normal amplifier of the type which have been used in prior art systems of this type, this tends to cause the signal voltage to be highly distorted in the voltage amplication stages so that in many cases, the voltage supplied to the grids of the discriminator is positive over more than half the cycle and has a negative peak of relatively short duration. It will be apparent from the foregoing description that where such occurs, the grids of the tubes in the discriminator stage will not only be positive during the half cycle in which the input voltage is in phase with the anode voltage of one of the tubes in the discriminator stage, but will also be positive during part of the other half cycle when the anode of the other tube is positive, so that both triodes of the discriminator stage conduct though on opposite half cycles. Since they oppose each other, the power actually supplied to winding 28 is further decreased. By the use of my amplifier, I avoid these undesirable characteristics. To accomplish this, I have provided means for reducing the magnitude of both the positive and negative peaks of the input voltage whenever they exceed a predetermined value. With my arrangement, small signals of sinusoidal wave form are amplified and applied to the control grids 154 and 157 of output stage 15 in their original form. As the amplitude of the signals increases, however, both extremities of the input wave form are limited to the desired level. This is accomplished by the limiting triodes 71 and 133, and by the manner in which the triodes 61 and 126 are connected into the circuit. This action will now be described.

Triode 71, it will be recalled, is connected between the grid 60 and cathode 65 of triode 61 in series with resistor 80 of the power supply. Triode 71, acting as a parallel-diode limiter in the first preliminary stage 13, conducts whenever the input reaches a more negative potential than the negative potential at junction point 108 in the power supply, or, in other words, that across resistor 80. Current flows through triode 71, acting as a diode, and series resistor 62. Since resistor 62 is large compared to the plate-cathode resistance of triode 71, connected as a diode, essentially the entire input voltage is developed across resistor 62, limiting the negative half cycle to the value of the negative potential at junction point 108.

The grid-cathode circuit of triode 61 may be employed as a limiter circuit in exactly the same way as the plate-cathode circuit of triode 71, connected as a diode. The positive half cycle of the input voltage is limited to the voltage level of the cathode 65, which is connected to a positive potential at junction point 107 in the power supply. During the positive portion of the input signal, the control grid 60 attempts to swing positive. Grid current flows through resistor 62 whenever the positive peak of the input voltage is greater than the voltage across resistor 66, developing a voltage drop of such polarity as to oppose the positive input signal. This limits the positive swing of the grid to essentially the cathode potential determined by the voltage across resistor 66, since resistor 62 is large compared to the grid-cathode resistance when grid current is flowing.

It will be seen that as the input signal increases, the output wave form of the first preliminary stage 13 more closely approaches a rectangular wave. This is an important point since the power output of the output stage 15 is dependent upon the wave form supplied to the control grids 154 and 157 of twin triode 152.

The triode 133, acting as a parallel-diode limiter in the second preliminary stage 14, limits the negative excursion of the controlling grid 125 of triode 126 to the value of the negative potential at junction point 109 in the power supply. It will be recalled that the resistors 104 and 80 connected between junction point 109 of the power supply and ground are connected between the anode 135 and ground. Thus, current may flow through the triode 133 whenever the magnitude of the negative peak of the input voltage to triode 14 exceeds the voltage between junction point 109 and ground. Thus, the amount of the negative peak in the input circuit of triode 126 is automatically limited to the voltage between junction point 109 and ground.

The triode 126 acts to limit by its anode saturation characteristics the maximum value of the peaks of the output voltage during the half cycles in which the grid 125 is positive. Thus, the swing of the output voltage in both positive and negative directions is further limited in the second stage 14. Moreover, where the amplitude of the input voltage is such that the triode 126 operates at saturation, the wave form is improved by a further flattening of the peaks of the output voltage during the half cycles in which anode saturation occurs.

Thus, whenever the signal voltage is above a predetermined relatively low value, the wave form of the input voltage supplied to the discriminator stages approaches that of a rectangular voltage of fixed magnitude.

It will be seen that by the action of limiting triodes 71 and 133 and by the action of triodes 61 and 126 in limiting the voltage, the input voltage supplied to the grids 154 and 157 of the discriminator stage is always of approximately the same magnitude regardless of how great is the signal voltage supplied to the input of the amplifier by the bridge 11. Thus, whenever the pressure change is above a predetermined relatively small value, full power is supplied to the motor 16 and this power remains substantially the same no matter how great the pressure change may be. Furthermore, the power supplied to the motor is much greater at even small signals than with prior amplifiers. This is due to the lack of undesirable distortion of the wave form. While the wave form tends to approach that of a rectangular wave, this desirably affects the operation of the discriminator stage 152. This discriminator stage has an alternating voltage applied to the anode, it will be recalled. By providing a flat top input voltage to the discriminator stage, the sinusoidal wave form of the voltage applied to the output circuit is more nearly reproduced than where the input voltage to the grids is likewise sinusoidal. In other words, during the initial portion of each half cycle while the anode voltage is relatively small, the input voltage is at its maximum value which is assumed throughout the half cycle. Thus, more power is actually supplied to the winding of motor 28 than would be the case if the input voltage were likewise sinusoidal.

While I have shown a specific embodiment of my invention for purposes of illustration, it is to be understood that the scope of the invention is to be limited only by the appended claims.

I claim as my invention:

1. An electronic amplifier comprising at least one voltage amplification stage and a discriminator stage, said voltage amplification stage comprising an electronic discharge device having an anode, a cathode, and a control element, said discriminator stage comprising a plurality of electronic discharge devices each comprising an anode, a cathode, and a control element, means for connecting the anode and cathode of said device of said voltage amplification stage in an output circuit with a voltage source, connecting means including a source of alternating voltage for applying alternating voltage to each of the anodes of the devices of said discriminator stage, connecting means for applying to each of the control elements of said discriminator devices a voltage which is determined by a voltage in said output circuit of said voltage amplification stage, said connecting means being so effective to apply said voltages that the phase relationship between the voltages applied to the anode and control element of one of said devices of said discriminator stage is 180° different from that between the voltages applied to the anode and control element of the other of said devices of said discriminator stage, means for applying to the control element of said voltage amplification stage a variable magnitude alternating signal voltage reversible in phase and of such phase relation with respect to said source of alternating voltage that the voltages applied to the control element and anode of one of said devices of said discriminator stage tend to be in phase with each other and the voltages applied to the control element and anode of the other of said devices tend to be 180° out of phase with each other with the result that one or the other of the devices is conductive dependent upon the phase of said signal voltage, and means for limiting the magnitude of the voltage applied to each of said control elements of said discriminator stage regardless of the magnitude of said signal voltage, said last named means comprising an impedance of relatively high value in series with the control element of said voltage amplification stage and a unidirectionally conductive device in parallel with said control element and cathode of said voltage amplification stage and being current conductive in a direction extending between said cathode and control element only when the negative peaks of the control element voltage exceed a predetermined value.

2. An electronic amplifier comprising at least one voltage amplification stage and a discriminator stage, said voltage amplification stage comprising an electronic discharge device having an anode, a cathode, and a control element, said discriminator stage comprising a plurality of electronic discharge devices each comprising an anode, a cathode, and a control element, means for connecting the anode and cathode of said device of said voltage amplification stage in an output circuit with a voltage source, connecting means including a source of alternating voltage for applying alternating voltage to each of the anodes of the devices of said discriminator stage, connecting means for applying to each of the control elements of said discriminator devices a voltage which is determined by a voltage in said output circuit of said voltage amplification stage, said connecting means being so effective to apply said voltages that the phase relationship between the voltages applied to the anode and control element of one of said devices of said discriminator stage is 180° different from that between the voltages applied to the anode and control element of the other of said devices of said discriminator stage, means for applying to the control element of said voltage amplification stage a variable magnitude alternating signal voltage reversible in phase and of such phase relation with respect to said source of alternating voltage that the voltages applied to the control element and anode of one of said devices of said discriminator stage tend to be in phase with each other and the voltages applied to the control element and anode of the other of said devices tend to be 180° out of phase with each other with the result that one or the other of the devices is conductive dependent upon the phase of said signal voltage, and means for limiting the magnitude of the voltage applied to each of said control elements of said discriminator stage regardless of the magnitude of said signal voltage, said last named means comprising an impedance of relatively high value in series with the control element of said voltage amplification stage and a unidirectionally conductive device and a source of unidirectional voltage in series with each other and in parallel with said control element and cathode of said voltage amplification stage, the voltage necessary to cause conduction of said device being of such polarity as to be in opposition to the voltage across said unidirectional source, and said device being current conductive in a direction extending between said cathode and control element only when the negative peaks of the control element voltage exceed a predetermined value exceeding that of said unidirectional voltage.

ROBERT R. CHAPMAN.

REFERENCES CITED

The following references are of record in the file of this patent:

UNITED STATES PATENTS

| Number | Name | Date |
|---|---|---|
| 1,426,826 | Egerton | Aug. 22, 1922 |
| 1,788,401 | Meagher | Jan. 13, 1931 |
| 1,977,624 | Davis | Oct. 23, 1934 |
| 1,989,829 | Specht | Feb. 5, 1935 |
| 2,115,881 | Roosenstein | May 3, 1938 |
| 2,176,663 | Browne et al. | Oct. 17, 1939 |
| 2,226,459 | Bingley | Dec. 24, 1940 |
| 2,322,218 | Baird | June 22, 1943 |
| 2,370,692 | Shepherd | Mar. 6, 1945 |
| 2,406,856 | Satterlee | Sept. 3, 1946 |
| 2,407,876 | Godet | Sept. 17, 1946 |
| 2,425,733 | Gille et al. | Aug. 19, 1947 |
| 2,426,497 | Field | Aug. 26, 1947 |
| 2,426,711 | Shaffer | Sept. 2, 1947 |
| 2,446,563 | Upton | Aug. 10, 1948 |
| 2,450,479 | Lindsay | Oct. 5, 1948 |

FOREIGN PATENTS

| Number | Country | Date |
|---|---|---|
| 552,118 | Great Britain | Mar. 24, 1943 |